United States Patent
Watanabe et al.

(10) Patent No.: US 8,436,644 B2
(45) Date of Patent: May 7, 2013

(54) CONFIGURATION METHOD AND FPGA CIRCUIT RE-EXECUTING CONFIGURATION BASED ON ADJUSTED CONFIGURATION DATA

(75) Inventors: Hiroaki Watanabe, Kawasaki (JP); Naoki Maezawa, Kawasaki (JP); Chikahiro Deguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 43 days.

(21) Appl. No.: 13/064,236

(22) Filed: Mar. 11, 2011

(65) Prior Publication Data
US 2011/0227605 A1  Sep. 22, 2011

(30) Foreign Application Priority Data
Mar. 12, 2010  (JP) .................................. 2010-056298

(51) Int. Cl.
  H03K 19/173  (2006.01)
(52) U.S. Cl.
  USPC .................................. 326/38; 326/41; 326/9
(58) Field of Classification Search .............. 326/37–41, 326/47
  See application file for complete search history.

(56) References Cited

U.S. PATENT DOCUMENTS

| | | | |
|---|---|---|---|
| 7,576,557 B1 * | 8/2009 | Tseng et al. | 326/9 |
| 7,746,699 B1 * | 6/2010 | Edwards et al. | 365/185.18 |
| 2003/0160633 A1 * | 8/2003 | Terrill et al. | 326/39 |
| 2006/0117164 A1 * | 6/2006 | Coxe et al. | 712/15 |
| 2008/0215935 A1 * | 9/2008 | Goel et al. | 714/708 |
| 2011/0179322 A1 * | 7/2011 | Lee et al. | 714/719 |

FOREIGN PATENT DOCUMENTS

| | | |
|---|---|---|
| JP | 2000-101421 | 4/2000 |
| JP | 2005-243937 | 9/2005 |

* cited by examiner

*Primary Examiner* — Jany Tran
(74) *Attorney, Agent, or Firm* — Staas & Halsey LLP

(57) ABSTRACT

A configuration method performs a configuration of a FPGA circuit by setting configuration data from a configuration circuit to the FPGA circuit. The method counts, within the FPGA circuit, a number of times a configuration of the FPGA circuit fails. The method adjusts, within the FPGA circuit, the configuration data at a time when the configuration failed if the counted number exceeds an upper limit value, and re-executes the configuration based on the adjusted configuration data. The method sets the configuration data in which the configuration is succeeded from the FPGA circuit to the configuration circuit when the configuration is successful.

15 Claims, 9 Drawing Sheets

CONFIGURATION METHOD AND FPGA CIRCUIT RE-EXECUTING CONFIGURATION BASED ON ADJUSTED CONFIGURATION DATA

CROSS-REFERENCE TO RELATED APPLICATIONS

This application is based upon and claims the benefit of priority of the prior Japanese Patent Application No. 2010-056298, filed on Mar. 12, 2010, the entire contents of which are incorporated herein by reference.

FIELD

The present invention generally relates to configuration methods and configuration control circuits, and more particularly to a configuration method and a configuration control circuit which may set configuration data, such as a clock frequency and slew rate of a FPGA (Field Programmable Gate Array) circuit, when starting operation of the FPGA circuit, and to such a FPGA circuit.

BACKGROUND

When starting operation of the FPGA circuit, a configuration is performed to set configuration data (or FPGA circuit data) using a configuration circuit illustrated in FIG. 1 or FIG. 2, for example. FIG. 1 is a diagram for explaining an example of the configuration circuit with respect to a single FPGA circuit, and FIG. 2 is a diagram for explaining an example of the configuration circuit with respect to a plurality of FPGA circuits.

In FIG. 1, a FPGA circuit (or ROM (Read Only Memory) circuit) 1-1 is formed by a flash memory that stores configuration data "DATA" of a FPGA circuit 2 specified by a user. The configuration data "DATA" include parameters, such as a clock frequency (or operation frequency), and circuit data of the FPGA circuit 2.

On the other hand, the FPGA circuit 2 includes a configuration data memory 21, a FPGA internal circuit 22, an input and output (I/O) buffer 23, a configuration control circuit 24, a clock generating circuit 25, and an I/O buffer 26 that are connected as illustrated in FIG. 1. The configuration control circuit 24 includes a CRC (Cyclic Redundancy Check) circuit 241, a main controller 242, and a decoder 243. The clock generating circuit 25 is formed by a ring oscillator that includes a tap adjusting circuit 251 and a plurality of inverter circuits 252 that are connected in series. The clock generating circuit 25 generates a configuration clock signal CLK to be output from the FPGA circuit 2.

The memory 21 stores set values that determine the logic of the FPGA internal circuit 22, and the set values determine various settings of resources within the FPGA circuit 2. The FPGA internal circuit 22 forms a logic function part in which the set values stored in the memory 21 are set. The I/O buffer 23 forms an interface usable by a user circuit (not illustrated). In the configuration control circuit 24, the CRC circuit 241 detects a data error by comparing a CRC code added to the configuration data "DATA" and a CRC code generated from the configuration data "DATA" read from the configuration circuit 1-1 and input to the FPGA circuit 2, and supplies to the main controller 242 an error detection signal that indicates whether the data error was detected. The main controller 242 supplies the clock frequency within the configuration data "DATA" depending on whether the error detection signal indicates that the data error was detected. In addition, when no data error is detected and the configuration is successful, the main controller 242 outputs a success signal that indicates that the configuration was successful. On the other hand, when the data error is detected and the configuration fails, the main controller 242 outputs an error signal that indicates that a configuration occurred. The decoder 243 decodes the value of the clock frequency, and controls the tap adjusting circuit 251 of the clock generating circuit 25 based on the decoded value, in order to adjust the tap of the inverter circuits 252 and set the frequency of the clock signal CLK generated from the clock generating circuit 25. The clock signal CLK is supplied to the configuration control circuit 24, and is also supplied to the configuration circuit 1-1 via the I/O buffer 26.

In FIG. 2, a configuration circuit 1-1 is provided with respect to a plurality of FPGA circuits (#1 through #N, where N is a natural number greater than 1) 2-1 through 2-N. In this example, the FPGA circuit 2-1 functions as a master, and the FPGA circuits 2-2 through 2-N function as slaves. The configuration circuit 1-2 inputs the configuration data "DATA" to the master FPGA circuit 2-1, in a manner similar to the configuration circuit 1-1 described above. The master FPGA circuit 2-1 supplies the clock signal CLK to the configuration circuit 1-2, in a manner similar to the FPGA circuit 2 described above. On the other hand, the clock signal CLK is also supplied to the slave FPGA circuits 2-2 through 2-N. In addition, the configuration data "DATA" from the configuration circuit 1-2 are successively supplied to the slave FPGA circuits 2-2 through 2-N via the master FPGA circuit 2-1.

For the sake of convenience, a description will be given of the configuration for the case illustrated in FIG. 1.

The configuration of the FPGA circuit 2 using the configuration circuit 1-1 illustrated in FIG. 1 may fail. The main reason for the failure of the configuration is in most cases a transfer failure or error of the configuration data "DATA", caused by mixing of noise to the configuration data "DATA" and signal decay or deterioration on a printed circuit board (not illustrated) mounted with the FPGA circuit 2. When the configuration of the FPGA circuit 2 fails, the configuration is in most cases ended as a configuration error. When making a reconfiguration of the FPGA circuit 2, the configuration is re-executed under the same conditions as the failed configuration.

Conventionally, the configuration of the FPGA circuit 2 is performed by providing a frequency setting path from the configuration circuit 1-1 to the clock generating circuit 25 within the FPGA circuit 2, and manually adjusting the value of the clock frequency of the configuration circuit 1-1 in order to manually adjust the set value of the clock frequency of the FPGA circuit 2 by the user. This manual adjustment is repeated until the configuration of the FPGA circuit 2 becomes a success, thereby requiring a relatively large number of steps. In the configuration circuit 1-1 illustrated in FIG. 1, the manual adjustment of the clock frequency is possible, but the manual adjustment of the slew rate is not possible.

For example, it is conceivable to avoid the configuration error by setting the clock frequency to an extremely low frequency, so that the configuration of the FPGA circuit 2 becomes a success. However, this conceivable method should not be employed for the following reasons.

That is, due to the increase in the scale of the recent FPGA circuit, the tendency is for the amount of configuration data to increase and for the time required for the configuration to increase. The starting of a system that includes the FPGA circuit is affected by the time required for the configuration. For this reason, the clock frequency of the configuration of the FPGA circuit is desirably set to a relatively high frequency in order to reduce the configuration time. However, when the clock frequency is set to the relatively high frequency, the slew rate of the clock signal becomes relatively high, and it becomes necessary to make a rising edge of the signal sharp.

On the other hand, if a device defect exists within the FPGA circuit, layout and wiring information that does not use the defective device may be found by switching a plurality of layout and wiring information prepared in advance, as proposed in a Japanese Laid-Open Patent Publication No. 2005-243937, for example. However, this proposed method does not take into consideration the error in the configuration itself of the FPGA circuit.

A self-configuration function of a programmable device is proposed in a Japanese Laid-Open Patent Publication No. 2000-101421, for example.

Hence, in the configuration of the FPGA circuit using the conventional manual adjustment, a considerable burden is put on the user every time the adjustment of the clock frequency is unsatisfactory, because the clock frequency of the FPGA circuit is manually adjusted to suit an operating environment in which the FPGA circuit is used, such as the circuit board on which the FPGA circuit is mounted and the ambient temperature of the FPGA circuit. In other words, the user must repeat the manual adjustment in order to optimize the clock frequency. In addition, even if the configuration circuit is the same, there are cases where it may be better to change the clock frequency for each FPGA circuit product, and in such cases, the cost of manually adjusting the clock frequency is generated for each product. Hence, it may be difficult to reduce the cost of manually adjusting the clock frequency when performing the configuration of the FPGA circuit.

Furthermore, the plurality of FPGA circuits 2-1 through 2-N may be connected as illustrated in FIG. 2, and the configuration may fail due to the effects of unpredictable reflection noise or the like, depending on the interconnection or wiring on the circuit board mounted with the FPGA circuits 2-1 through 2-N.

Therefore, the conventional configuration of the FPGA circuit requires the manual adjustment of the clock frequency of the FPGA circuit, and there was a problem in that the burden on the use to make the manual adjustment is relatively large.

SUMMARY

Accordingly, it is an object in one aspect of the embodiment to automatically adjust the configuration data of the FPGA circuit, such as the clock frequency and slew rate of the FPGA circuit.

According to one aspect of the embodiment, there is provided a configuration method for performing a configuration of a FPGA (Field Programmable Gate Array) circuit by setting configuration data from a configuration circuit to the FPGA circuit, that includes counting, within the FPGA circuit, a number of times a configuration of the FPGA circuit fails; adjusting, within the FPGA circuit, the configuration data at a time when the configuration failed if the counted number exceeds an upper limit value, and re-executing the configuration based on the adjusted configuration data; and setting the configuration data in which the configuration is succeeded from the FPGA circuit to the configuration circuit when the configuration is successful.

According to another aspect of the embodiment, there is provided a FPGA (Field Programmable Gate Array) circuit that includes a configuration control circuit configured to control a configuration of a FPGA circuit by setting configuration data sent from a configuration circuit to the FPGA circuit, the configuration control circuit including a counter configured to count a number of times a configuration fails; and a main controller configured to adjust the configuration data if the counted number exceeds an upper limit value, and to re-execute the configuration based on the adjusted configuration data, wherein the main controller sets the configuration data at a time when the configuration is successful from the FPGA circuit to the configuration circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments of the present invention will be described with reference to the accompanying drawings.

According to one embodiment, configuration data of the FPGA circuit, such as a clock frequency (or operation frequency) and slew rate of a FPGA circuit, are automatically adjusted. The configuration data that cause a successful configuration of the FPGA circuit may be automatically adjusted by the FPGA circuit without requiring manual adjustment by a user, that is, without requiring the user to be aware of the adjustment of the configuration data. Hence, the adjustment cost of the configuration may be suppressed to a relatively low cost.

A description will now be given of the configuration method and the configuration control circuit in each embodiment according to the present invention.

(First Embodiment)

Figure 1:
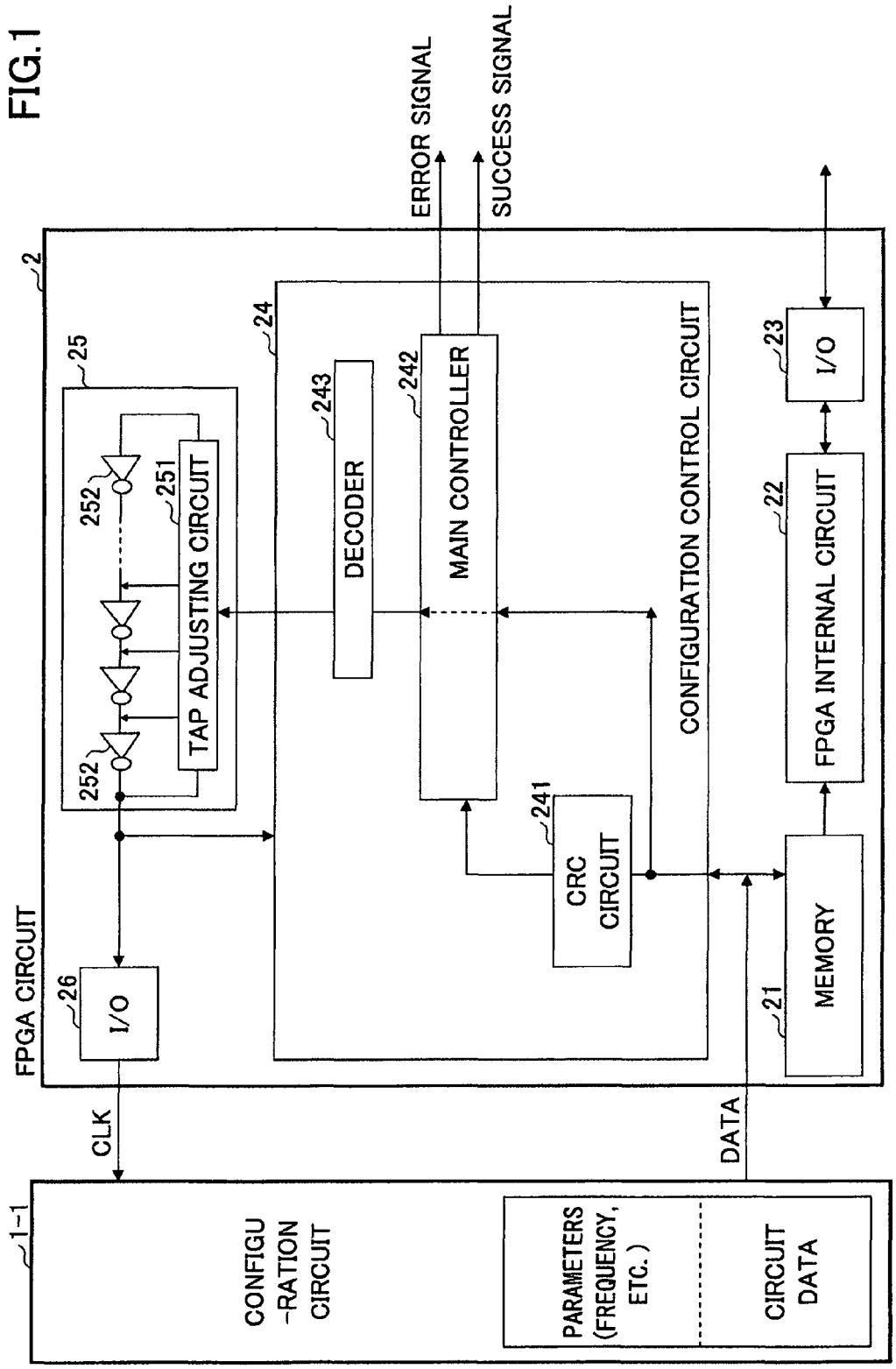
FIG. 1 is a diagram for explaining an example of a configuration circuit with respect to a single FPGA circuit.
Figure 2:
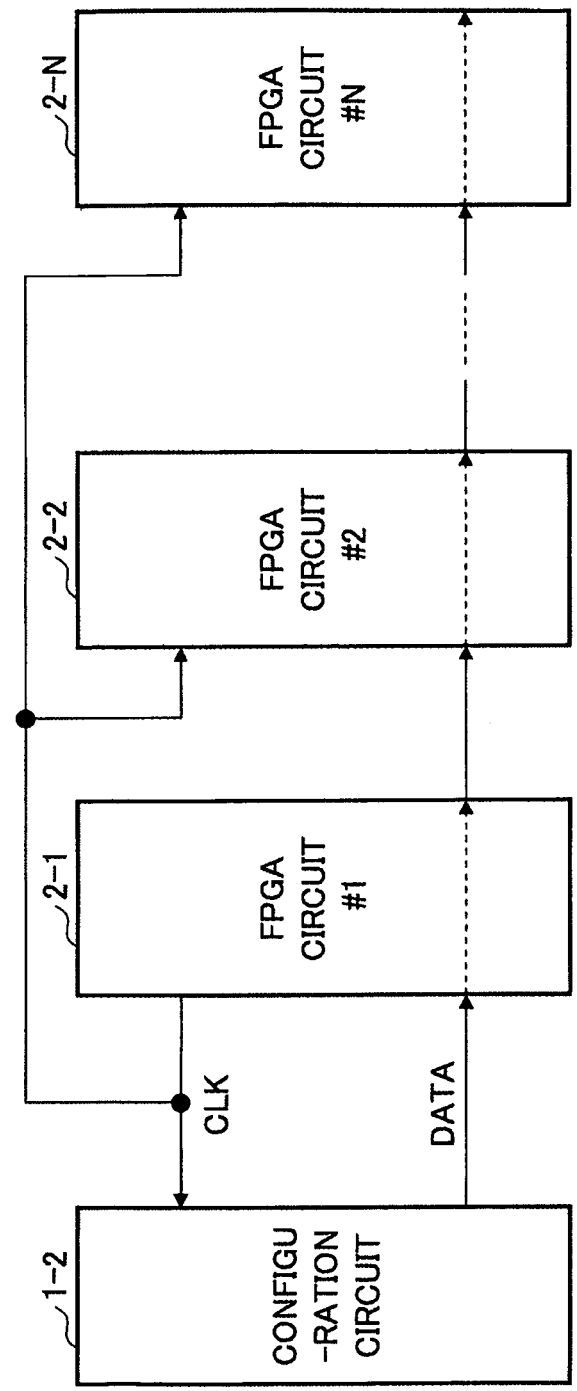
FIG. 2 is a diagram for explaining an example of a configuration circuit with respect to a plurality of FPGA circuits.
Figure 3:
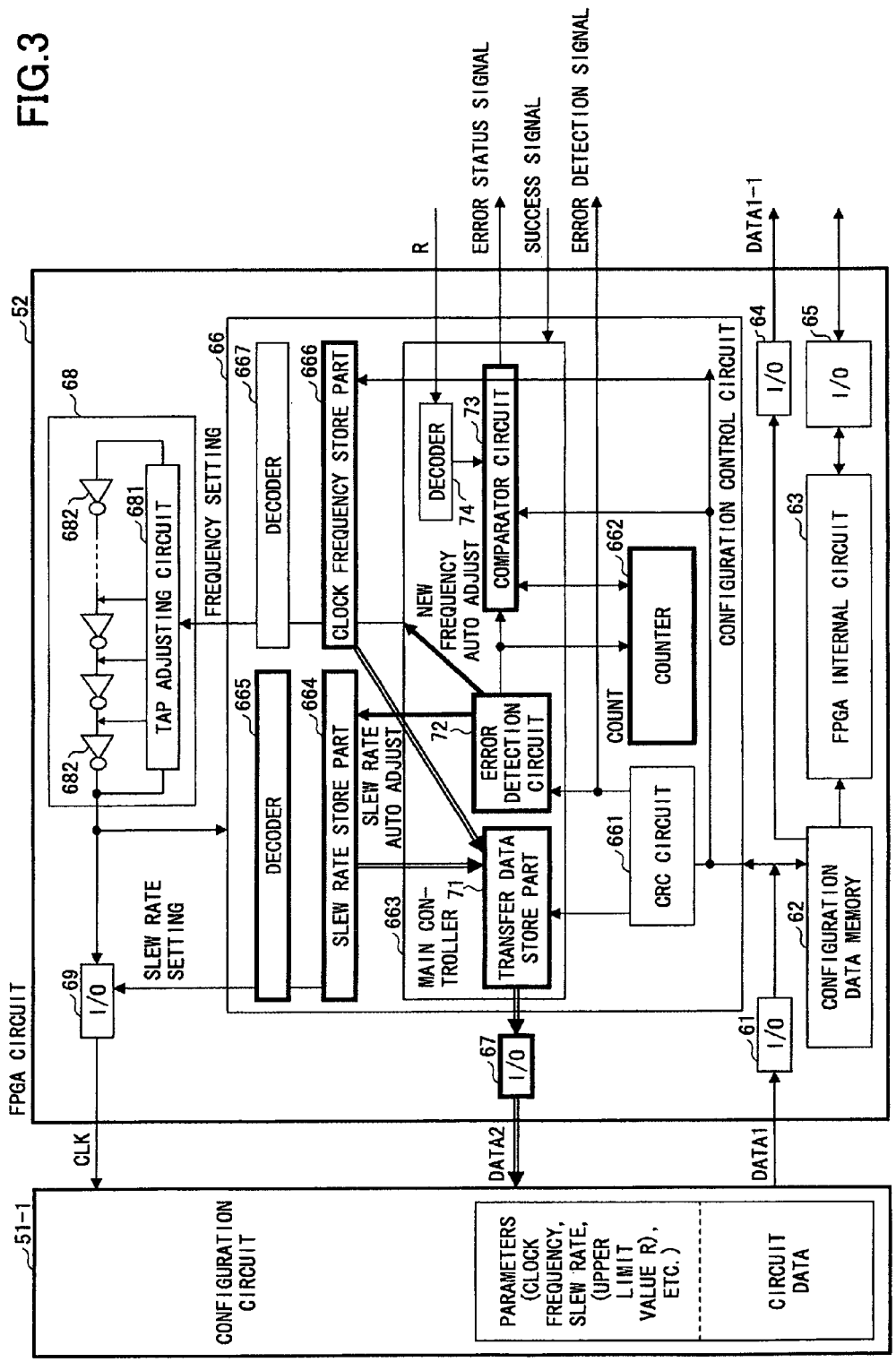
FIG. 3 is a diagram for explaining an example of a configuration circuit in a first embodiment of the present invention.

FIG. 3 is a diagram for explaining an example of a configuration circuit in a first embodiment of the present invention. In this embodiment, the present invention is applied to a case where the configuration circuit is provided with respect to a single FPGA circuit. In FIG. 3, blocks indicated by bold solid lines denote functional blocks that may perform the automatic adjustment using a path indicated by bold solid lines and store the settings using a path indicated by double solid lines.

In FIG. 3, a configuration circuit (or ROM (Read Only Memory) circuit) 51-1 is formed by a flash memory that stores configuration data "DATA" of a FPGA circuit 52 specified by the user. The configuration data "DATA" include parameters, such as the clock frequency (or operation frequency) and slew rate, and circuit data of the FPGA circuit 52. The clock frequency refers to the frequency of a clock signal CLK that will be described later, and the slew rate refers to the slew rate of the clock signal CLK.

On the other hand, the FPGA circuit 52 includes an input and output (I/O) buffer 61, a configuration data memory 62, a FPGA internal circuit 63, I/O buffers 64 and 65, a configuration control circuit 66, an I/O buffer 67, a clock generating circuit 68, and an I/O buffer 69 that are connected as illustrated in FIG. 3. The configuration control circuit 66 includes a CRC (Cyclic Redundancy Check) circuit 661, a counter 662, a main controller 663, a slew rate store part 664, a decoder 665, a clock frequency store part 666, and a decoder 667. The main controller 663 includes a transfer data store part 71, an error detection circuit 72, a comparator circuit 73, and a decoder 74. The clock generating circuit 68 is formed by a ring oscillator that includes a tap adjusting circuit 681 and a plurality of inverter circuits 682 that are connected in series. The clock generating circuit 68 generates the configuration clock signal CLK to be output from the FPGA circuit 52.

The I/O buffer 61 supplies to the configuration control circuit 66 configuration data "DATA1" read from the configuration circuit 51-1 and input to the FPGA circuit 52 in synchronism with the clock signal CLK. The memory 61 stores set values that determine the logic of the FPGA internal circuit 63, and the set values determine various settings of resources within the FPGA circuit 52. The FPGA internal circuit 63 forms a logic function part in which the set values stored in the memory 62 are set. As will be described later, when a FPGA circuit (not illustrated) of a next stage (or a latter stage) is connected to the output of the FPGA circuit 52 and the configuration of the FPGA circuit 52 is successfully completed, the I/O buffer 64 may output the configuration data at the time when the configuration is successful to the FPGA circuit of the next stage, as configuration data "DATA-1". The I/O buffer 65 forms an interface usable by a user circuit (not illustrated) external to the FPGA circuit 52.

In the configuration control circuit 66, the CRC circuit 661 detects a data error by comparing a CRC code added to the configuration data "DATA1" and a CRC code generated from the configuration data "DATA1" read from the configuration circuit 51-1 and input to the FPGA circuit 52 in synchronism with the clock signal CLK, and supplies to the error detection circuit 72 within the main controller 663 an error detection signal that indicates whether the data error was detected. When the FPGA circuit of the next stage or the user circuit is connected to the FPGA circuit 52, the error detection signal may be output to the FPGA circuit of the next stage or the user circuit. If no data error is detected in the CRC circuit 661 and the configuration is successful, the error detection signal may be used in the FPGA circuit of the next stage or the user circuit as a success signal that indicates that the configuration was successful. In addition, the CRC circuit 661 supplies the configuration data "DATA1" to the transfer data store part 71 within the main controller 663. The counter 662 counts a re-execution number n (n is a natural number greater than or equal to 0) that indicates the number of times the configuration is repeated due to the generation of the configuration error (or failure of the configuration).

A slew rate t stored in the slew rate store part 664 and a clock frequency f stored in the clock frequency store part 666 are supplied to the transfer data store part 71 within the main controller 663. For this reason, the transfer data store part 71 stores the configuration data at the time when the configuration was successful, such as the clock frequency f and slew rate t, to the configuration circuit 51-1 via the I/O buffer 67, as new configuration data "DATA2". In other words, the configuration data "DATA1" are automatically adjusted by the configuration control circuit 66, and the more optimized configuration data "DATA2" is automatically set in the configuration circuit 51-1. As a result, the configuration data "DATA2" that are automatically set in the configuration circuit 51-1 become usable when performing the next configuration.

On the other hand, the error detection circuit 72 detects whether the configuration error exists, based on the error detection signal from the CRC circuit 661, and notifies an error detection result to the comparator circuit 73 and the counter 662. In addition, when the error detection circuit 72 detects the configuration error, the error detection circuit 72 modifies, that is, automatically adjusts, the clock frequency f stored in the clock frequency store part 666 and the slew rate t stored in the slew rate store part 664, according to a preset rule. For example, the clock frequency f is lowered according to the rule, and the slew rate t is reduced according to the rule. Further, when the error detection circuit 72 detects no configuration error, the error detection circuit 72 judges that the configuration was successful, and supplies the slew rate t within the configuration data "DATA1" to the slew rate store part 664, and supplies the clock frequency f within the configuration data "DATA1" to the clock frequency store part 666. The decoder 74 receives an external input of a set signal indicating an upper limit value R of the repetition of the configuration, and inputs to the comparator circuit 73 the upper limit value R that is obtained by decoding the set signal. In other words, the decoder 74 decodes the set signal into the upper limit value R having a format referable (or accessible) within the FPGA circuit 52 (or within the main controller 663). The comparator circuit 73 compares the upper limit value R and the counted value (or re-execution number) n of the counter 662. If the re-execution number n exceeds the upper limit value R, the comparator circuit 73 notifies the generation of a configuration error in which the re-execution number n exceeds the upper limit value R, by outputting an error status signal indicating this configuration error.

The clock frequency f stored in the clock frequency store part 666 may be supplied from the I/O buffer 61. In addition, in a case where the configuration data "DATA1" stored in the configuration circuit 51-1 includes the upper limit value R, the upper limit value R may be supplied to the comparator circuit 73 from the I/O buffer 61.

The clock frequency f stored in the clock frequency store part 666 is decoded by the decoder 667. The tap adjusting circuit 681 of the clock generating circuit 68 is controlled based on a decoded value output from the decoder 667, in order to set the clock frequency f of the clock signal CLK that is generated from the clock generating circuit 68. The clock signal CLK is supplied to the configuration control circuit 66, and is also supplied to the configuration circuit 51-1 via the I/O buffer 69. The slew rate t stored in the slew rate store part 664 is decoder by the decoder 665. A timing at which the clock signal CLK is supplied from the I/O buffer 69 to the configuration circuit 51-1 is controlled based on a decoded value output from the decoder 665, depending on the setting of the slew rate t.

If the FPGA circuit of the next stage is connected to the output of the FPGA circuit 52 as will be described later, and the configuration in the FPGA circuit of the next stage is successfully completed, the configuration success signal output from the FPGA circuit of the next stage may be input to the configuration control circuit 66 (or the main controller 663), in order to enable the FPGA circuit 52 to recognize whether the configuration was successful in the FPGA circuit of the next stage.

Figure 4:
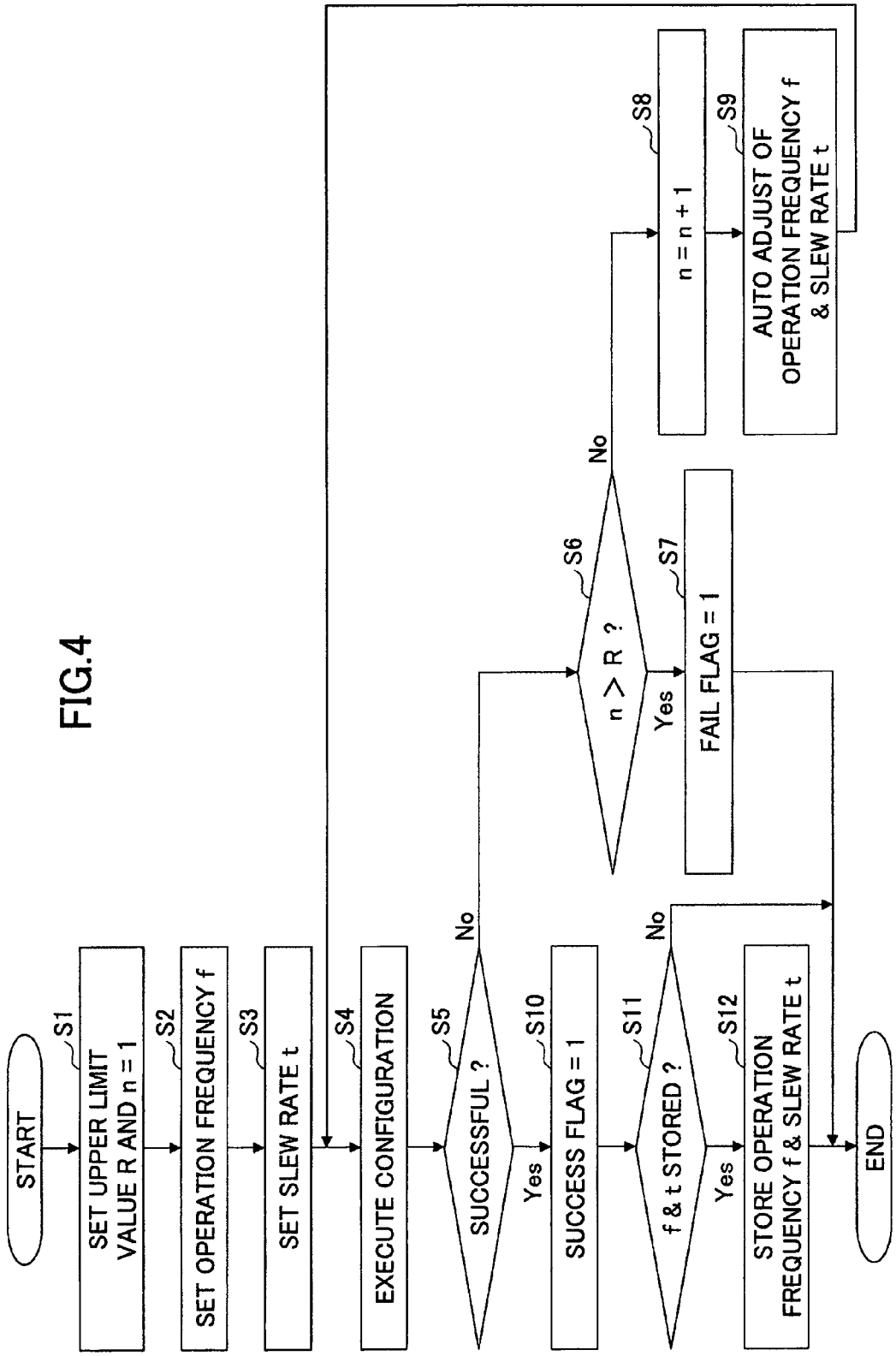
FIG. 4 is a flow chart for explaining a configuration process.

FIG. 4 is a flow chart for explaining a configuration process executed within the FPGA circuit 52. In FIG. 4, a step S1 sets the upper limit value R of the re-execution number n for the case where the configuration fails, and sets the re-execution number n to an initial value "1". The upper limit value R may be set from outside the FPGA circuit 52 or, may be set from the configuration circuit 51-1. A step S2 sets the clock frequency f that is to be used at the time of the configuration of the FPGA circuit 52, and a step S3 sets the slew rate t that is used at the time of the configuration. Initial values of the clock frequency f and the slew rate t may be values set in the configuration circuit 51-1.

A step S4 executes the configuration of the FPGA circuit 52. The configuration is executed during operation of the FPGA circuit 52, for example. A step S5 judges, in the configuration control circuit 66, whether the configuration was successful. If the configuration was successful and the judgement result in the step S5 is YES, a step S10 sets a success flag, indicating that the configuration was successful, to "1".

A step S11 judges whether the clock frequency f and the slew rate t are stored in the clock frequency store part 666 and the slew rate store part 664, respectively. If the judgement result in the step S11 is YES, a step S12 stores in the configuration circuit 51-1 the clock frequency f stored in the clock frequency store part 666 and the slew rate t stored in the slew rate store part 664, an the process ends. On the other hand, if the judgement result in the step S11 is NO, the process ends.

If the configuration fails and the judgement result in the step S5 is NO, a step S6 judges whether n>R. If the judgement result in the step S6 is YES, a step S7 sets a fail flag, indicating that the configuration failed, to "1", and the process ends. On the other hand, if the judgement result in the step S6 is NO, a step S8 increments the re-execution number n to n=n+1. In addition, a step S9 automatically adjusts the clock frequency f and the slew rate t, and the process returns to the step S4. Accordingly, after the step S9, the step S4 executes the configuration, and the re-execution of the configuration and the automatic adjustment of the configuration data are repeated until the configuration becomes a success or, the configuration fails and the re-execution number n of the configuration exceeds the upper limit value R.

Next, a description will be given of the automatic adjustment performed in the step S9. In a first example, the clock frequency f is automatically adjusted to a value that is 10% lower, for example, because the cause of the configuration failure may be an excessively high clock frequency f. In a second example, the slew rate t is automatically adjusted to a value that is reduced by 10%, because the cause of the configuration failure may be an excessively high slew rate t. In a third example, the clock frequency f and the slew rate t are automatically adjusted by combining the first and second examples described above.

According to this embodiment, a path is provided from the error detection circuit 72 of the main controller 663 to the clock generating circuit 68 and the I/O buffer 69, within the configuration control circuit 66 of the FPGA circuit 52 illustrated in FIG. 3, in order to provide a mechanism to re-execute the configuration by automatically adjusting the clock frequency f and the slew rate t. Hence, a manual adjustment of the configuration data "DATA1" by the user is unnecessary in order to avoid the configuration error, and the burden on the user to make the manual adjustment is reduced.

In addition, a path is provided to the I/O buffer 67 from the main controller 663, the clock frequency store part 666, and the slew rate store part 664 within the configuration control circuit 66 illustrated in FIG. 3, in order to provide a mechanism to store and set the clock frequency f and the slew rate t at the time when the configuration was successful within the configuration circuit 51-1. Hence, the cost of manually adjusting the configuration data "DATA1" for each FPGA product including the FPGA circuit 52 may be reduced.

Therefore, according to this embodiment, the FPGA circuit 52 itself automatically adjusts the configuration data and controls the configuration to a success, and it is unnecessary for the user to manually adjust and manually set the optimum clock frequency and slew rate in order to control the configuration to the success. In addition, even if the optimum clock frequency or slew rate for controlling the configuration to the success changes due to a change in an operating environment in which the FPGA circuit 52 operates, such as the ambient temperature of the FPGA circuit 52, the user does not need to be aware of such changes because the FPGA circuit 52 itself automatically adjusts and automatically sets the configuration data. Furthermore, because the optimum clock frequency and slew rate at the time when the configuration was successful are automatically set in the configuration circuit 51-1, the next configuration may be performed using the optimum clock frequency and slew rate in order to suppress the configuration error.

(Second Embodiment)

Figure 5:
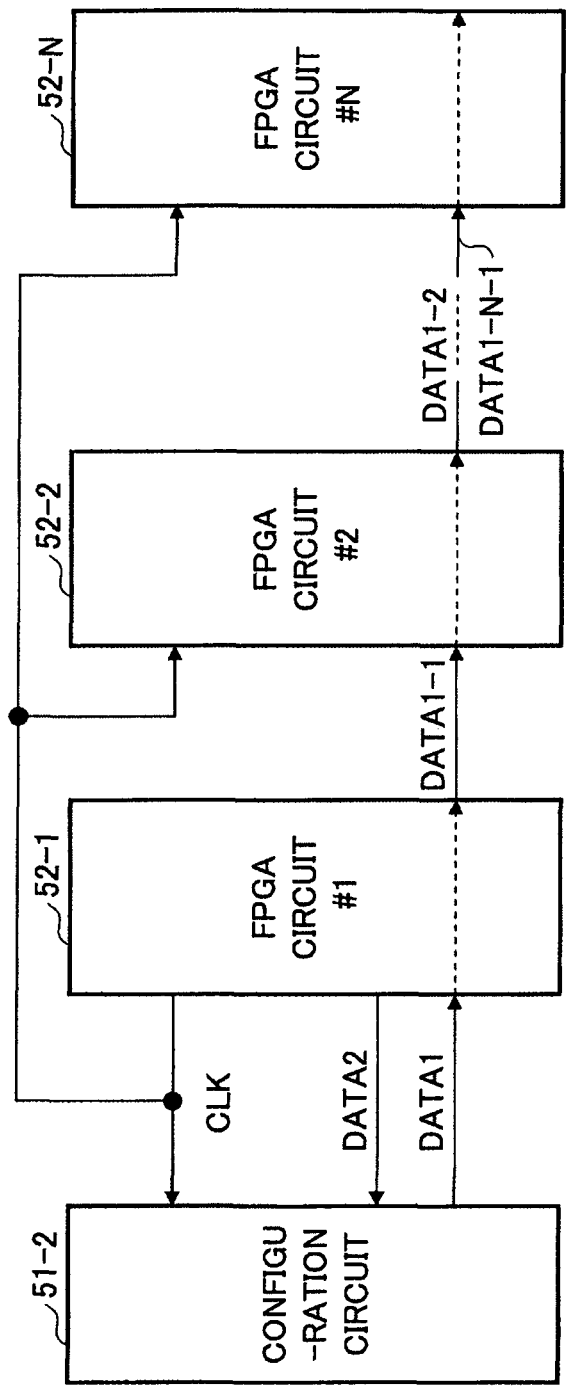
FIG. 5 is a diagram for explaining an example of the configuration circuit in a second embodiment of the present invention.

FIG. 5 is a diagram for explaining an example of the configuration circuit in a second embodiment of the present invention. In this embodiment, the present invention is applied to a case where the configuration circuit is provided with respect to a plurality of FPGA circuits.

In FIG. 5, a configuration circuit 51-2 is provided with respect to a plurality of FPGA circuits (#1 through #N, where N is a natural number greater than 1) 52-1 through 52-N. In this example, the FPGA circuit 52-1 functions as a master, and the FPGA circuits 52-2 through 52-N function as slaves. The configuration circuit 51-2 inputs the configuration data "DATA1" to the master FPGA circuit 52-1, in a manner similar to the configuration circuit 51-1 described above. The master FPGA circuit 52-1 supplies the clock signal CLK to the configuration circuit 51-2, in a manner similar to the FPGA circuit 52 described above. On the other hand, the clock signal CLK is also supplied to the slave FPGA circuits 52-2 through 52-N. In addition, the configuration data "DATA1" from the configuration circuit 51-2 are successively supplied to the slave FPGA circuits 52-2 through 52-N via the master FPGA circuit 52-1, as configuration data "DATA1-1" through "DATA1-N-1".

Figure 6:
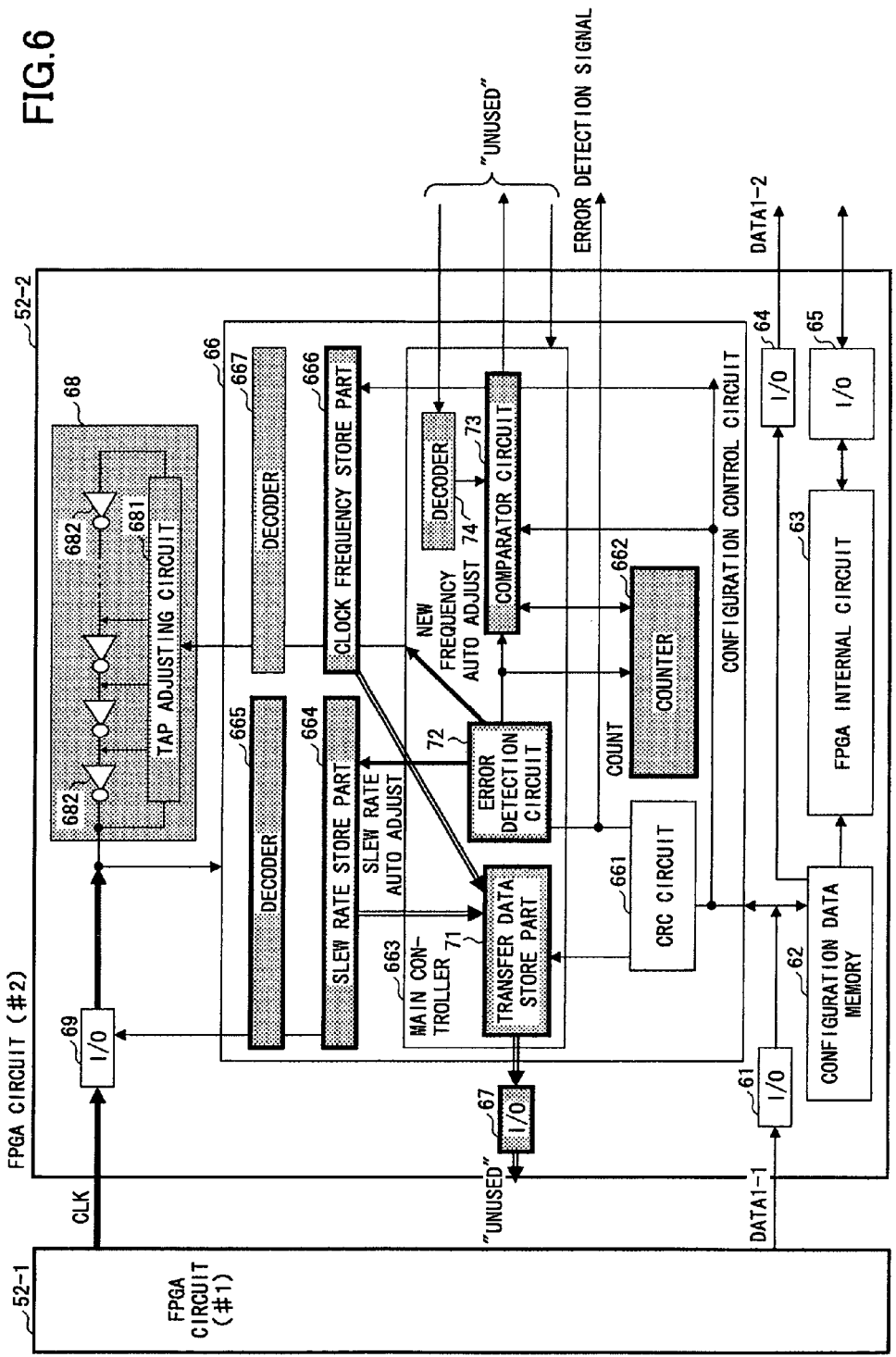
FIG. 6 is a diagram illustrating a structure of a configuration control circuit in the second embodiment.

FIG. 6 is a diagram illustrating a structure of the configuration control circuit in the second embodiment. FIG. 6 illustrates the structure of the configuration circuit of the FPGA circuit 52-2 in the latter stage for a case where the number of FPGA circuits is 2 (that is, N=2). In FIG. 6, the FPGA circuit 52-1 has the same structure as the FPGA circuit 52 illustrated in FIG. 3, and the configuration process executed within the FPGA circuit 52-1 is the same as that illustrated in the flow chart of FIG. 4. Accordingly, in FIG. 6, those parts that are the same as those corresponding parts in FIG. 3 are designated by the same reference numerals, and a description thereof will be omitted.

In FIG. 6, circuit parts within the FPGA circuit 52-2 represented by halftone shades indicate function parts that may be unused, unlike the FPGA circuit 52-1. In addition, input and output signals that may be unused are labeled as "unused" in FIG. 6. Moreover, a transfer direction of the clock signal CLK with respect to the I/O buffer 69 within the FPGA circuit 52-2 is opposite to that with respect to the I/O buffer 69 within the FPGA circuit 52-1. However, except for the fact that the circuit parts represented by the halftone shades may be unused and not in operation, the operation of the FPGA circuit 52-2 is basically the same as the operation of the FPGA circuit 52-1. Configuration data "DATA1-2" output from the I/O buffer 64 within the FPGA circuit 52-2 is supplied to the I/O buffer 61 within the FPGA circuit 52-3 (not illustrated) of the next stage.

In this embodiment, each of the slave FPGA circuits 52-2 through 52-N operate in synchronism with the clock signal CLK that is output from the master FPGA circuit 52-1, and the slave FPGA circuit 52-$i$ (i is a natural number greater than or equal to 2) is supplied with the configuration data that passed through the FPGA circuit 52-$i$-1 of the preceding stage. As illustrated in FIG. 5, the configuration data "DATA1-1" output from the master FPGA circuit 52-1 are supplied to the slave FPGA circuit 52-2 of the next stage, and the configuration data "DATA1-2" output from the slave FPGA circuit 52-2 are supplied to the slave FPGA circuit 52-3 (not illustrated) of the next stage, . . . , and the configuration data "DATA1-N-1" output from the slave FPGA circuit 52-N-1 are supplied to the slave FPGA circuit 52-N of the next stage.

Figure 7:
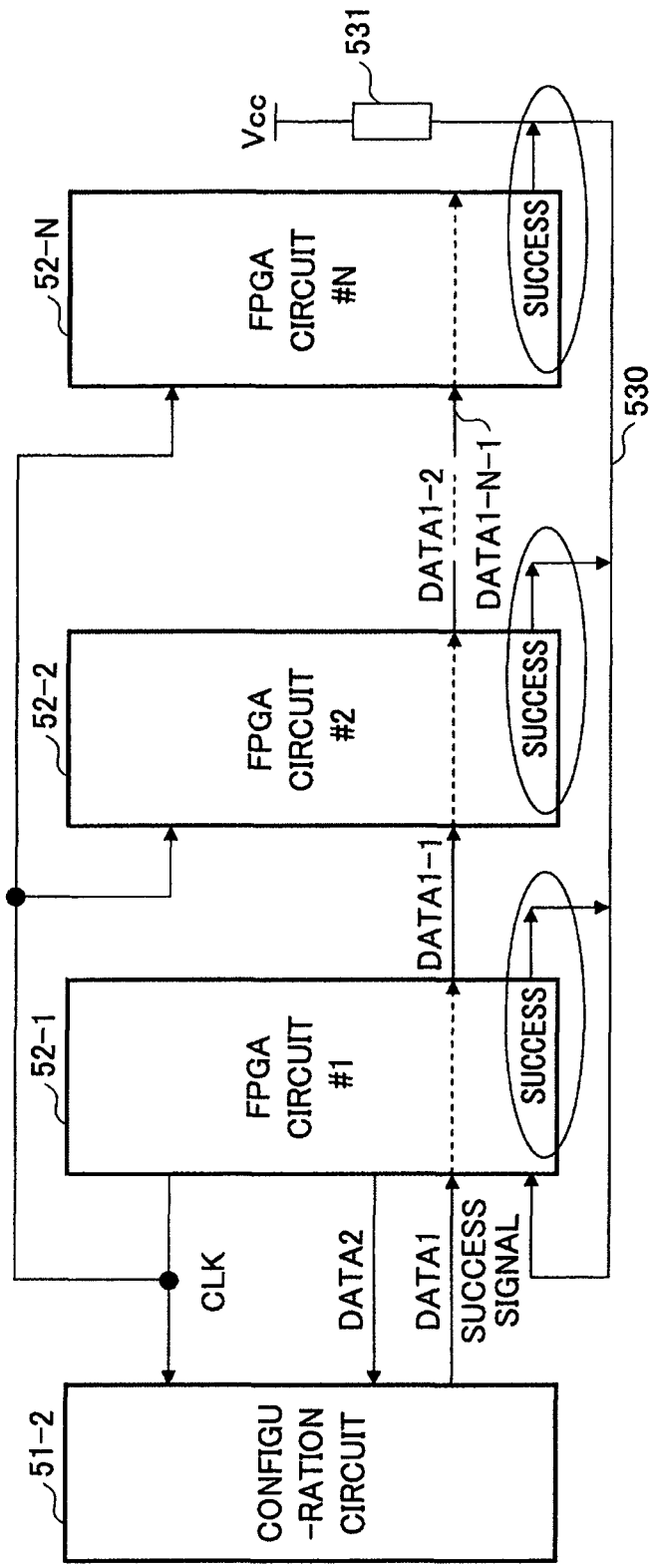
FIG. 7 is a diagram for explaining outputting of a configuration success signal in the second embodiment.

FIG. 7 is a diagram for explaining outputting of a configuration success signal in the second embodiment. In FIG. 7, those parts that are the same as those corresponding parts in FIG. 5 are designated by the same reference numerals, and a description thereof will be omitted. FIG. 7 illustrates a transfer path of the configuration success signal, the illustration of which is omitted in FIG. 5.

FIG. 7 illustrates a case where the configuration success signal is an open-drain signal. In this case, the configuration success signal output from each of the FPGA circuits 52-1 through 52-N is input to the main controller 663 within the FPGA circuit 52-1 of the first stage via a signal line 530. In addition, the signal line 530 is connected to a power supply voltage Vcc via a pull-up resistor 631. When all of the configuration success signals (that is, open-drain signals) output from the FPGA circuits 52-1 through 52-N are in a high-impedance (or high-Z) state, a high-level configuration success signal is input to the FPGA circuit 52-1 in the first stage due to the pull-up resistor 531, and the successful configuration in each of the FPGA circuits 52-1 through 52-N may be recognized.

In FIGS. 5 and 7, the parts other than the master FPGA circuit 52-1, including the slave FPGA circuits 52-2 through 52-N, may be connected using various other connecting methods or arrangement.

Figure 8:
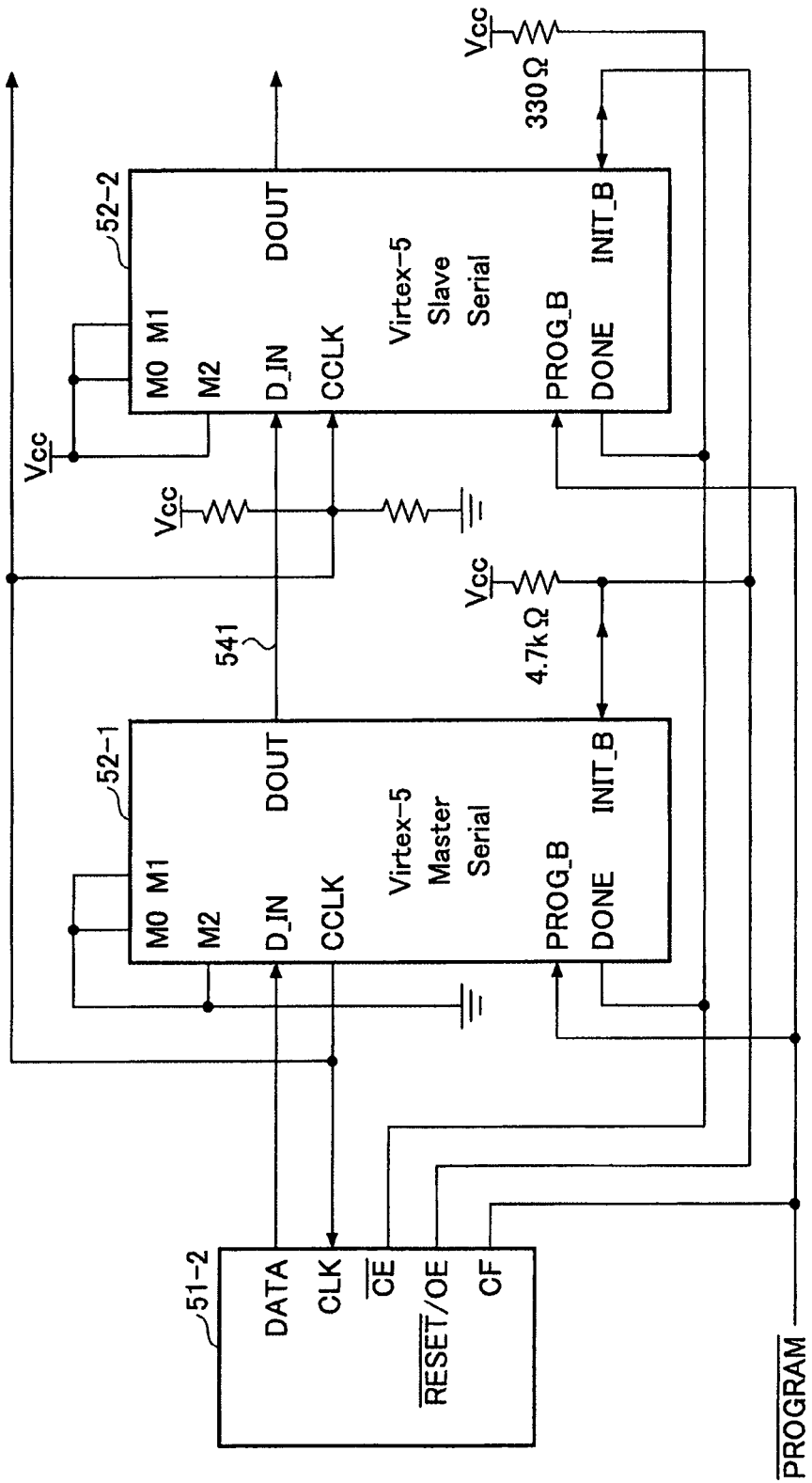
FIG. 8 is a diagram illustrating a first example of a connection of slave FPGA circuits.

FIG. 8 is a diagram illustrating a first example of the connection of the slave FPGA circuits. For the sake of convenience, FIG. 8 only illustrates the configuration circuit 51-2, the master FPGA circuit 52-1, and the slave FPGA circuit 52-2. For example, the configuration circuit 51-2 may be formed by a PROM (Programmable ROM) manufactured by Xilinx, Inc., and the master FPGA circuit 52-1 and the slave FPGA circuit 52-2 may be formed by Virtex-5 family (or series) FPGAs manufactured by Xilinx, Inc., and thus, the illustration of all of the terminals is omitted in FIG. 8. A signal /PROGRAM instructs the start of the configuration. In this example, the a data bus 541 that connects the master FPGA circuit 52-1 and the slave FPGA circuit 52-2 and transfer the configuration data is formed by a serial bus.

Figure 9:
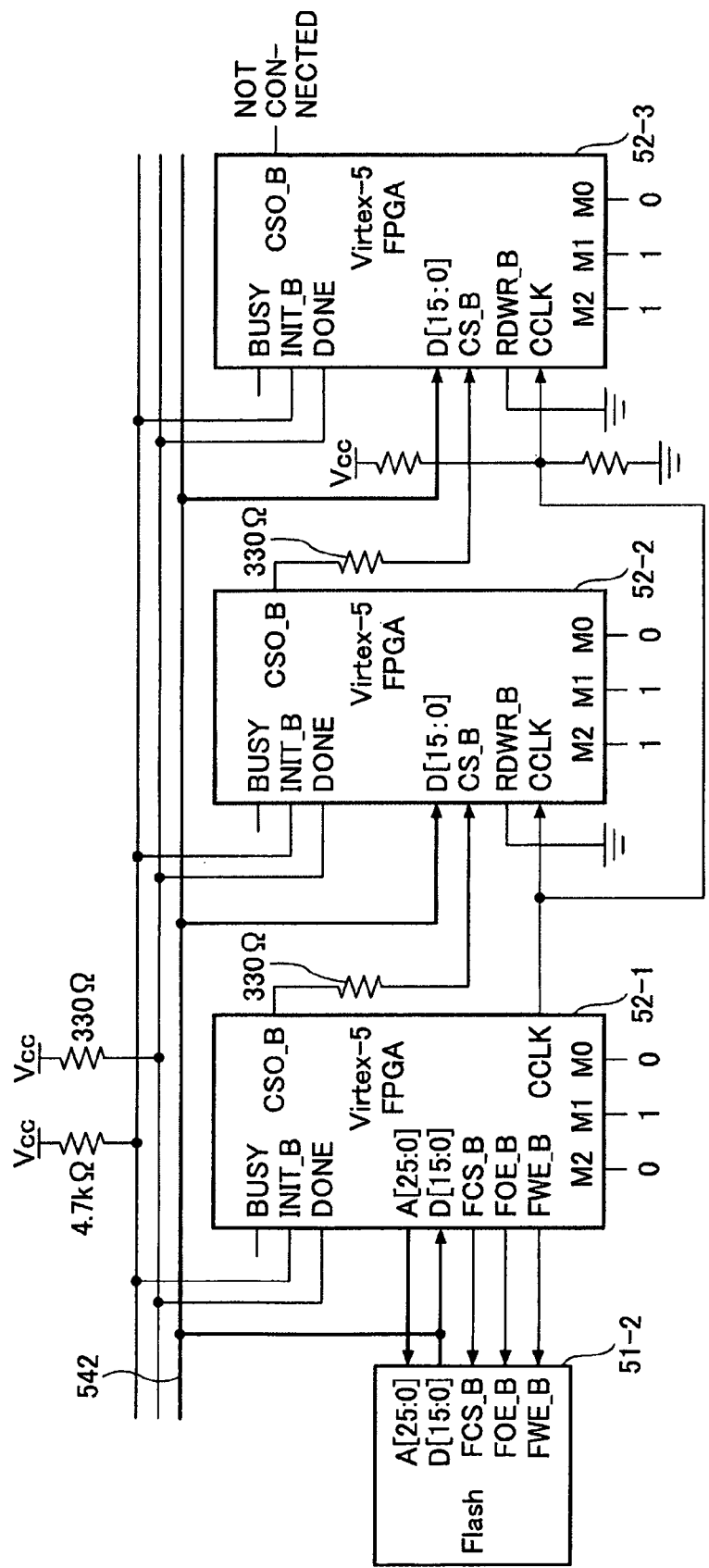
FIG. 9 is a diagram illustrating a second example of the connection of the slave FPGA circuits.

FIG. 9 is a diagram illustrating a second example of the connection of the slave FPGA circuits. For the sake of convenience, FIG. 9 only illustrates the configuration circuit 51-2, the master FPGA circuit 52-1, and the slave FPGA circuits 52-2 and 52-3. For example, the configuration circuit 51-2 may be formed by a flash memory manufactured by Xilinx, Inc., and the master FPGA circuit 52-1 and the slave FPGA circuits 52-2 and 52-3 may be formed by Virtex-5 family (or series) FPGAs manufactured by Xilinx, Inc., and thus, the illustration of all of the terminals is omitted in FIG. 9. In this example, the data buses 542 that connect the master FPGA circuit 52-1 and the slave FPGA circuits 52-2 and 52-3 and transfer the configuration data are formed by parallel buses. In addition, when an error detection signal output from a CSO_B terminal of the master FPGA circuit 52-1 indicates that a successful configuration, the configuration process of the slave FPGA circuit 52-2 that receives the error detection signal at a CS_B terminal thereof starts.

Therefore, according to this embodiment, the FPGA circuit 52-1 itself automatically adjusts the configuration data and controls the configuration to a success, and it is unnecessary for the user to manually adjust and manually set the optimum clock frequency and slew rate in order to control the configuration to the success, even when the FPGA circuits 52-1 through 52-N are connected in a plurality of stages. Hence, the advantageous effects obtainable in the first embodiment described above may also be obtained in this embodiment.

Although the embodiments are numbered with, for example, "first," or "second," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contribute by the inventor to furthering the art, and are to be construed as being without limitation to such specifically recited examples and conditions, nor does the organization of such examples in the specification related to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A configuration method for performing a configuration of a FPGA (Field Programmable Gate Array) circuit by setting configuration data from a configuration circuit to the FPGA circuit, comprising:

counting, within the FPGA circuit, a number of times a configuration of the FPGA circuit fails;

adjusting, within the FPGA circuit, the configuration data that are set to the FPGA circuit at a time when the configuration fails, until the counted number exceeds an upper limit value, and re-executing the configuration based on the adjusted configuration data; and setting the adjusted configuration data that are set to the FPGA circuit at a time when the configuration is successful, from the FPGA circuit to the configuration circuit, as next configuration data for a next configuration, when the configuration is successful.

2. The configuration method as claimed in claim 1, wherein the configuration data include a clock frequency of a clock signal of the FPGA circuit, and comprising:

inputting to the configuration circuit a clock signal having a clock frequency included in the adjusted configuration data that are set to the FPGA circuit, when setting the adjusted configuration data from the FPGA circuit to the configuration circuit.

3. The configuration method as claimed in claim 2, comprising:

detecting an existence of a data error of the configuration data that are set from the configuration circuit to the FPGA circuit; and counting the number of configuration failure based on the detected data error.

4. The configuration method as claimed in claim 2, comprising:

outputting to an outside of the FPGA circuit a status signal indicating that the configuration is successful when no configuration failure is counted.

5. The configuration method as claimed in claim 2, comprising:

outputting to an outside of the FPGA circuit a status signal indicating a configuration failure in which a number of times the configuration is re-executed exceeds the upper limit value, when the number of times the configuration is re-executed exceeds the upper limit value.

6. The configuration method as claimed in claim 2, further comprising:

setting the upper limit value to the FPGA circuit from one of the configuration circuit and an external circuit other than the configuration circuit.

7. The configuration method as claimed in claim 2, comprising:

outputting the configuration data that are set to the FPGA circuit at the time when the configuration is successful from the FPGA circuit to another FPGA circuit that is coupled in a stage next to the FPGA circuit, as configuration data for the other FPGA circuit.

8. The configuration method as claimed in claim 7, further comprising:

supplying a clock signal from the FPGA circuit to the other FPGA circuit.

9. A FPGA (Field Programmable Gate Array) circuit comprising:

a configuration control circuit configured to control a configuration of a FPGA circuit by setting configuration data received from a configuration circuit to the FPGA circuit, the configuration control circuit including:

a counter configured to count a number of times the configuration fails; and a main controller configured to adjust the configuration data that are set to the FPGA circuit at a time when the configuration fails, until the counted number exceeds an upper limit value, and to re-execute the configuration based on the adjusted configuration data, wherein the main controller sets the adjusted configuration data that are set to the FPGA circuit at a time when the configuration is successful, from the FPGA circuit to the configuration circuit, as next configuration data for a next configuration, when the configuration is successful.

10. The FPGA circuit as claimed in claim 9, wherein the adjusted configuration data include a clock frequency of a clock signal of the FPGA circuit, and wherein the main controller includes a circuit configured to input a clock signal having a clock frequency included in the adjusted configuration data that are set to the FPGA circuit, when setting the adjusted configuration data from the FPGA circuit to the configuration circuit.

11. The FPGA circuit as claimed in claim 10, wherein the main controller outputs to an outside of the FPGA circuit a status signal indicating that the configuration is successful when no configuration failure is counted by the counter.

12. The FPGA circuit as claimed in claim 9, wherein the configuration control circuit includes:

an error check circuit configured to detect an existence of a data error in the configuration data that are set from the configuration circuit to the FPGA circuit, wherein the main controller notifies the existence of the data error detected by the error check circuit to the counter so that the counter counts the number of times the configuration fails based on the existence of the data error notified from the main controller.

13. The FPGA circuit as claimed in claim 9, wherein the main controller outputs to an outside of the FPGA circuit a status signal indicating a configuration failure in which a number of times the configuration is re-executed exceeds the upper limit value, when the number of times the configuration is re-executed exceeds the upper limit value.

14. The FPGA circuit as claimed in claim 9, comprising:

a FPGA internal circuit configured to output the configuration data that are set to the FPGA circuit at the time when the configuration is successful to another FPGA circuit that is coupled in a stage next to the FPGA circuit, as configuration data for the other FPGA circuit.

15. The FPGA circuit as claimed in claim 14, wherein the FPGA circuit and one or a plurality of other FPGA circuits successively coupled in one or more stages subsequent to the FPGA circuit are coupled via one of a serial bus and parallel buses configured to transfer configuration data.

* * * * *